United States Patent [19]

Sakamoto

[11] Patent Number: 5,276,651
[45] Date of Patent: Jan. 4, 1994

[54] VOLTAGE GENERATING DEVICE GENERATING A VOLTAGE AT A CONSTANT LEVEL AND OPERATING METHOD THEREOF

[75] Inventor: Wataru Sakamoto, Hyogo, Japan

[73] Assignee: Mitsubishi Denki Kabushiki Kaisha, Tokyo, Japan

[21] Appl. No.: 953,376

[22] Filed: Sep. 30, 1992

[30] Foreign Application Priority Data

Mar. 3, 1992 [JP] Japan .................................. 4-045670

[51] Int. Cl.$^5$ .............................................. G11C 5/14
[52] U.S. Cl. ...................................... 365/226; 307/268
[58] Field of Search ............... 365/226, 229, 189.09, 365/203; 307/261, 268, 296.6, 296.8; 363/60, 59, 63

[56] References Cited

U.S. PATENT DOCUMENTS

| | | | |
|---|---|---|---|
| 4,801,887 | 1/1989 | Wegener | 307/261 |
| 4,812,735 | 3/1989 | Sawada et al. | 323/313 |
| 5,175,706 | 12/1992 | Edme | 369/226 |

FOREIGN PATENT DOCUMENTS 56-27952  3/1981  Japan .

*Primary Examiner*—Eugene R. LaRoche
*Assistant Examiner*—A. Zarabian
*Attorney, Agent, or Firm*—Lowe, Price, LeBlanc & Becker

[57] ABSTRACT

A circuit of a structure in which one end of a serial connection circuit of two capacitors is grounded, and the potential of another end is switched in a constant cycle is disclosed as a voltage generating circuit applicable to a half Vcc generating circuit, a substrate bias circuit, or the like. Electrical connection between a connection point between the capacitors and a predetermined load and electrical connection between the connection point and ground are controlled so that the potential of the connection point attains to be a constant potential in accordance with the ratio between the capacitance of the two capacitors in response to switching of the potential of the "another end" to a predetermined potential. As a result, a half Vcc generating circuit with reduced power consumption and layout area and a substrate bias circuit capable of biasing a semiconductor substrate to an arbitrary potential are realized.

19 Claims, 9 Drawing Sheets

VOLTAGE GENERATING DEVICE GENERATING A VOLTAGE AT A CONSTANT LEVEL AND OPERATING METHOD THEREOF

BACKGROUND OF THE INVENTION

1. Field of the Invention

The present invention relates generally to voltage generating devices and operating methods thereof and, more particularly, to a voltage generating device capable of generating a voltage at an arbitrary level with small power consumption and an operating method thereof.

2. Description of the Background Art

At present a semiconductor integrated circuit device such as a semiconductor memory device or the like is provided with a circuit which supplies a predetermined constant voltage to a predetermined part of the semiconductor integrated circuit device at least in a period in which an internal circuit of the semiconductor integrated circuit operates.

FIG. 7 is a schematic diagram illustrating a structure of a half Vcc generating circuit, which is an example of such a circuit.

A half Vcc generating circuit is generally used in a semiconductor memory device such as a DRAM (Dynamic Random Access Memory) or the like for precharging a bit line or an I/O line to a potential which is half a supply potential Vcc (normally 5 V), for fixing one electrode of a capacitor constituting a memory cell to a potential which is half the supply potential Vcc, in a period in which reading and writing of data are not performed, and so forth.

FIG. 8 is an equivalent circuit diagram illustrating a structure of a memory cell of a DRAM. Referring to FIG. 8, each memory cell of a DRAM includes a MOS transistor Tr, which has a gate connected to a word line WL, a drain connected to a bit line BL, and a source, and a capacitor C. One electrode of the capacitor C is connected to the source of the transistor Tr, and another electrode is connected to a so-called cell plate, a substrate portion in which a memory cell array is formed, in common with electrodes of capacitors C of all other memory cells (not shown). The cell plate is fixed to a potential which is half a supply potential Vcc to fix the potential of one electrode of the capacitor of each memory cell.

A bit line and an I/O line transmit data of logical values "1" and "0" as rise of potential (or fall of potential) and fall of potential (or rise of potential), respectively, to a circuit or signal line in the next stage. Therefore, if the bit line and I/O line are precharged to Vcc/2, which is a potential intermediate between the supply potential Vcc and a ground potential 0 V, in reading of data, it becomes easy for the potentials of the bit line and the I/O line to change according to whether read data is of the logical value "0" or of the logical value "1".

Next, the structure and operation of a conventional half Vcc generating circuit will be described with reference to FIG. 7.

A conventional half Vcc generating circuit includes resistors 1-3, which are connected in series with each other between a supply terminal Tcc to be supplied with a supply potential Vcc and ground GND, and an N-channel MOS transistor 4 and a P-channel MOS transistor 5, which are connected in series with each other between the supply terminal Tcc and the ground GND. The gates of transistors 4 and 5 are connected to the connection point between registers 1 and 2 and the connection point between registers 2 and 3, respectively. The potential of the connection point (a node N3) between transistors 4 and 5 is used as an output voltage Vout of the half Vcc generating circuit.

Current flows from the supply terminal Tcc through resistors 1-3 to the ground GND in a period in which the supply potential Vcc is supplied to supply terminal Tcc, so that the potential of the connection point between resistors 1 and 2 is a potential lower than the supply potential Vcc by a voltage drop caused by resistor 1, and the potential of the connection point between resistors 2 and 3 is a potential lower than the potential of the connection point between resistors 1 and 2 by a voltage drop caused by resistor 2. The values of resistance of respective resistors 1-3 are set so that the potential of the connection point (a node N1) between resistors 1 and 2 is a potential (Vcc/2+Vthn) which is higher than a potential Vcc/2, which is half the supply potential Vcc, by the threshold voltage Vthn of transistor 4 and so that the potential of the connection point (a node N2) of registers 2 and 3 is a potential (Vcc/2−Vthp) which is lower than the potential Vcc/2, which is half the supply potential Vcc, by the threshold voltage Vthp of transistor 5.

Transistor 4 is brought to ON state and supplies positive charge from the supply terminal Tcc to node N3 in a case where its gate potential Vgn is higher than a potential (Vout+Vthn) which is higher than the potential Vout of node N3 by its threshold voltage Vthn, i.e. in a case where the following expression is realized.

$$Vout < Vgn - Vthn$$

Transistor 5 is brought to ON state and supplies negative charge from the ground GND to node N3 in a case where its gate potential Vgp is lower than a potential (Vout−Vthp) which is lower than the potential Vout of node N3 by its threshold voltage Vthp, i.e. in a case where the following expression is realized.

$$Vout > Vgp + Vthp$$

Therefore, in a case where the potentials of node N1 and N2 are (Vcc/2+Vthn) and (Vcc/2−Vthp), respectively, if the potential Vout of node N3 becomes higher than Vcc/2, transistor 4 is brought to OFF state while transistor 5 is brought to ON state, so that the potential Vout of node N3 is lowered. However, if the potential Vout of node N3 becomes lower than Vcc/2, transistor 5 is brought to OFF state while transistor 4 is brought to ON state, so that the potential of node N3 rises. Accordingly, the potential Vout of node N3 is controlled to be always approximately Vcc/2 by setting the gate potentials Vgn and Vgp of transistors 4 and 5 to such potentials. In a state wherein the potential Vout of node N3 is stable at Vcc/2, transistors 4 and 5 are both in OFF state, so that no current flows from the supply terminal Tcc through transistors 4 and 5 to the ground GND.

FIG. 11 is a schematic diagram illustrating a structure of a substrate bias circuit, which is another example of a circuit which generates a voltage at a predetermined level in a semiconductor integrated circuit device.

A substrate bias circuit is provided in a semiconductor integrated circuit device for preventing malfunction of a circuit and degradation of electric characteristics of a circuit due to fluctuation in the potential of a semiconductor substrate.

FIG. 13 is a schematic diagram illustrating an example of a general structure of a data providing circuit in a semiconductor integrated circuit device. Referring to FIG. 13, the providing circuit generally includes two N-channel MOS transistors 12, 13 connected in series with each other between a supply potential $T_{DD}$, which is to be supplied with a supply potential $V_{DD}$ predetermined according to the potential level of an input/output signal, and ground GND. Potentials V1, V2 at levels complementary to each other and corresponding to data to be provided are applied from a circuit (not shown) in the preceding stage to the gates of transistors 12 and 13, respectively. The connection point between transistors 12 and 13 is connected, as an output terminal of the providing circuit, to an I/O pin (not shown).

Accordingly, in a period in which transistor 12 is in ON state, transistor 13 is in OFF state, and, conversely, in a period in which transistor 13 is in ON state, transistor 12 is in OFF state. Therefore, a high potential $V_{DD}$ of the supply terminal $T_{DD}$ or a low potential Vss of the ground GND appears onto the connection point between transistors 12 and 13 according to the output potentials v1, v2 of a circuit in the preceding stage.

If the potential of a semiconductor substrate becomes higher than the potential of the I/O pin, charge flows from an N+ region to a P well region in such a providing circuit. FIG. 14 is a diagram for explaining such a phenomenon. FIG. 14 shows a cross sectional view of the structure of transistor 12 (or 13) in FIG. 13.

Referring to FIG. 14, transistor 12 (or 13) includes N+ regions 200 and 300 formed as a drain and a source, respectively, on a P well 100 formed in a semiconductor substrate 1000 and a gate electrode 400 formed across the portion between N+ regions 200 and 300 on P well 100 with an insulating film (not shown) interposed therebetween. One N+ region 200 is connected to a supply terminal $T_{DD}$ (or ground GND) to receive a high potential $T_{DD}$ (or a low potential Vss), and the other N+ region 300 is connected to an I/O pin. Gate electrode 400 receives a signal v1 (or v2) from a circuit in the preceding stage of the providing circuit.

In a case where the potential of P well 100 is 0 V or more, if a negative potential is externally supplied to the I/O pin, for example, the PN junction formed by N+ region 300 and P well 100 is brought into a forward bias state, so that electrons e⁻ are supplied from N+ region 300 to P well 100. If this providing circuit is used in a DRAM, for example, the electrons e⁻ thus flowing into P well 100 cancel positive charge accumulated in a capacitor C (see FIG. 8.) in a memory cell, so that it happens that storage data in the memory cell is destructed.

In order to avoid such a phenomenon, the potential of semiconductor substrate 100, i.e. the potential of P well 100, may be held at a predetermined negative potential so that the PN junction formed by N+ region 300 and P well region 100 is not brought to the forward bias state.

FIG. 15 is a schematic diagram illustrating a structure of arbitrary one memory cell in a DRAM.

Referring to FIG. 15, when data is written, the potential of a word line WL is brought to a potential (normally a supply potential) of a high level which is considerably higher than the threshold voltage of a transistor Tr for a constant period, while the potential of a bit line BL is brought to the high level (in a case where data to be stored in a memory cell MC is "1") or a low level (in a case where the data to be stored in the memory cell MC is "0") according to the data to be stored in the memory cell MC. This causes a capacitor C to be charged or discharged. After a lapse of the constant period, the potential of the word line WL is brought to a potential (normally a ground potential) at the low level, which is sufficiently lower than the threshold voltage of the transistor Tr, so that in a case where the capacitor C is charged, charge accumulated in the capacitor C does not flow through the transistor Tr to the bit line BL.

When data is read, the potential of the word line WL is fixed at the high level for a constant period, while change in the potential of the bit line BL is detected. If charge is accumulated in the capacitor C, positive charge is supplied from the capacitor C through the transistor Tr to the bit line BL in the constant period, so that the potential of the bit line BL rises. If charge is not accumulated in capacitor C, positive charge is supplied from the bit line BL through the transistor Tr to the capacitor C in the constant period, so that the potential of the bit line BL lowers. Thus, rise of potential is caused in the bit line BL in a case where data "1" is stored in the memory cell MC, while fall of potential is caused in the bit line BL in a case where data "0" is stored in the memory cell MC, so that it is possible to discriminate data stored in the memory cell MC by detecting change in the potential of the bit line BL.

Now, in a period in which neither writing of data nor reading of data is performed, the potential of the word line WL is brought to the low level, so that the transistor Tr is brought to OFF state and cuts off the current flowing between the bit line BL and the capacitor C. However, in a case where the threshold voltage of the transistor Tr is too low, the transistor Tr is brought to ON state by only a little rise of potential in the word line WL due to some cause in a period in which neither writing of data nor reading of data is performed, so that charge accumulated in the capacitor C leaks through the transistor Tr to the bit line BL. As a result, storage data of the memory cell MC is destructed. In order to avoid such a phenomenon, it is necessary that the threshold voltage of the transistor Tr is set high.

Now, the relation between the threshold voltage $V_{th}$ of an N-channel MOS transistor (See FIG. 14.) and the square root of the absolute value $|V_{SB}|$ of the potential $V_{SB}$ of a P well 100 in which the N-channel MOS transistor is represented as $V_{th}=V_{tho}+\alpha$ $(|V_{SB}|)^{\frac{1}{2}}$. $V_{th}$ expresses the threshold voltage of the N-channel MOS transistor in a case where $V_{SB}=0$ V, and $\alpha$ is a constant. Specifically, the threshold voltage of the N-channel MOS transistor is larger as the potential of the substrate in which the N-channel MOS transistor is formed is a negative potential with a larger absolute value. Accordingly, in order to suppress generation of leakage of charge from the capacitor C to the bit line BL due to fluctuate in the potential of the word line WL, a semiconductor substrate in which a memory cell MC is formed may be held at an appropriate negative potential. As described above with reference to FIGS. 13 to 15, it is necessary to bias a semiconductor substrate to a certain constant negative potential $V_{BB}$ in order to solve various disadvantages. A substrate bias circuit is a circuit provided for that purpose.

Next, referring to FIGS. 11 and 12, the structure and operation of a conventional substrate bias circuit will be described.

FIG. 12 is a timing chart showing potential waveforms of control signals Φ1, Φ2 supplied to the substrate bias circuit in FIG. 11.

The substrate bias circuit includes inverters 5 and 9 receiving driving signals Φ1 and Φ2 of phases opposite to each other as shown in FIG. 12 (a) and (b), respectively, a capacitor 6 and a P-channel MOS transistor 8 which are connected in series with each other between an output terminal of inverter 5 and ground GND, and a capacitor 10 and a P-channel MOS transistor 11 which are connected in series with each other between an output terminal of inverter 9 and the ground GND. The potential of the connection point (a node N5) between capacitor 10 and transistor 11 is applied to the gate of transistor 8, and the ground potential is applied to the gate of transistor 11.

The substrate bias circuit further includes a P-channel MOS transistor 7 which is diode-connected. The gate of transistor 7 is connected to the connection point (a node N4) between capacitor 6 and transistor 8. The output voltage of inverter 5 is used as back gate voltages of transistors 7 and 8. The output voltage of inverter 9 is used as a back gate voltage of transistor 11.

The output potential of transistor 7 is applied as the output potential $V_{BB}$ of the substrate bias circuit to a semiconductor substrate (not shown).

If the potential of the driving signal Φ2 is switched from a high level to a low level (a time t1 in FIG. 12 (b)) in a period in which the potential of the driving signal Φ1 is at the low level, the potential of node N5 is raised by coupling of capacitor 10. The back gate voltage of transistor 11 is brought to the high level to cause transistor 11 to be brought to ON state, so that node N5 is electrically connected to the ground GND. As a result, the potential of node N5 is lowered. Such fall in the potential of node N5 causes transistor 8 to be brought to ON state, so that positive charge is pulled out of node N4 through transistor 8 to the ground GND.

Next, if the potential of the driving signal Φ1 is switched from the low level to the high level (a time t2 in FIG. 12), the output potential of inverter 5 is brought to the low level, so that charges are discharged from capacitor 6. This causes negative charge to be supplied from capacitor 6 to node N4, so that the potential of node N4 starts to fall to be negative.

The potential of node N5 is the ground potential 0 V, so that if the potential of node N4 becomes a negative potential, transistor 8 is brought to OFF state so that node N4 is electrically separated from the ground GND. If the potential of node N4 becomes such a negative potential, transistor 7 is brought to ON state. Accordingly, negative charges are discharged from the capacitor 6 through node N4 and transistor 7 in response to switching of the driving signal Φ1 from the low level to the high level.

The supply of the negative charge from capacitor 6 to node N4 causes the potential of node N4 to be finally a negative potential (−Vcc) having the same absolute value as that of the supply potential Vcc. Accordingly, with such discharge of negative charges, the output potential $V_{BB}$ of transistor 7 becomes a potential (−Vcc+Vthp) which is higher than the negative potential (−Vcc) having the same absolute value as that of the supply potential by the threshold voltage Vthp of transistor 7.

Next, if the driving signal Φ1 is switched from the high level to the low level in a period in which the potential of the driving signal Φ2 is at the low level (a time t3 in FIG. 12), the potential of node N4 rises, so that transistor 7 is brought to OFF state. This causes node N4 to be electrically separated from the semiconductor substrate.

Next, if the driving signal Φ2 is switched from the low level to the high level (a time t4 in FIG. 12), the output potential of inverter 9 is brought to the low level, so that negative charge is supplied from capacitor 10 to node N5, and thus the potential of node N5 becomes a negative potential. The back gate voltage of transistor 11 is brought to the low level to cause transistor 11 to be brought to OFF state, so that all the negative charge discharged from capacitor 10 is supplied to the gate of transistor 8. The potential of node N4 is the ground potential 0 V, so that transistor 8 is brought to ON state in response to the supply of the negative charge to the gate. This causes the potential of node N4 to return to the ground potential 0 V.

By repeating the circuit operation as described above, an approximately constant negative potential (−Vcc+Vthp) is provided from transistor 7 to bias the semiconductor substrate.

As described above, a voltage generating circuit which generates a voltage at a predetermined level in a semiconductor integrated circuit device is generally a circuit such as a half Vcc generating circuit (FIG. 7) in which the gate potentials of a plurality of MOS transistors connected in series with each other are set to an appropriate potential obtained by division of resistance so as to fix the connection points between those MOS transistors to a desired potential or a circuit of a so-called charge pumping type such as a substrate bias circuit (FIG. 11) in which charging and discharging of a capacitor are performed alternately to release a constant amount of charge in constant timing so as to generate a desired voltage. However, the circuits of such structures have problems as will be described in the following.

First, problems of a circuit of the former structure will be described with reference to FIGS. 7, 9 and 10.

FIG. 9 is a cross sectional view illustrating a structure of transistor 4 in FIG. 7. FIG. 10 is a cross sectional view illustrating a structure of transistor 5 in FIG. 7.

Referring to FIG. 7, a through current flows constantly from the supply terminal Tcc through resistors 1–3 to the ground GND in a period in which the supply potential Vcc is supplied to the supply terminal Tcc, i.e. in a period in which the half Vcc generating circuit operates. Accordingly, the power consumption of the conventional half Vcc generating circuit is large, and there is a problem that inhibits the approach to low power consumption, which is been requiring in many fields including the field of semiconductor integrated circuit devices at the present time.

Although the threshold voltage Vthn of transistor 4 and the threshold voltage Vthp of transistor 5 are set so that both of transistors 4 and 5 are not brought to ON state at the same time, if the threshold voltage of transistor 4 is different from the set value Vthn, or the threshold voltage of transistor 5 is different from the set value Vthp, there is a period in which both of transistors 4 and 5 are in ON state, so that a through current flows from the supply terminal Tcc through transistors 4 and 5 to the ground GND.

For example, if the threshold voltage of transistor 4 is lower than the set value Vthn, transistor 4 is in ON state even if the potential Vout of node N3 is higher than Vcc/2. On the other hand, if the potential Vout of node N3 is higher than Vcc/2, transistor 5 is in ON state. Accordingly, both of transistors 4 and 5 are in ON state, and a through current flows between the supply terminal Tcc and the ground GND.

As described above, the conventional half Vcc generating circuit also has a problem that a through current is increased due to irregularity in the threshold voltage of a MOS transistor in manufacture, i.e. the power consumption tends to be increased.

In order to reduce the current flowing between resistors 1 to 3, the values of resistance of resistors 1 to 3 may be increased. A resistive element is provided as a so-called diffusion resistor formed by diffusing impurities of an N type or a P type on a semiconductor substrate. The value of resistance of a diffusion resistor is determined by the ratio between the lengths of two sides of a region (normally rectangular) in which impurities are diffused. The value of resistance of a resistor element is larger as the ratio of the length of the side parallel to the direction of the flow of current to the length of another side vertical to the direction of the flow of the current is larger. Therefore, in order to increase the values of resistance of resistors 1 to 3 in FIG. 7, the layout areas of these respective resistors 1–3 on the semiconductor substrate are increased. Such increase in the layout areas of the components is unfavorable because it inhibits large scale integration of a semiconductor integrated circuit device.

Furthermore, also in the view of a circuit operation of the conventional half Vcc generating circuit as will be described in the following, it difficult to reduce the current flowing between resistors 1 to 3.

It is assumed that the potential Vout of node N3 becomes a potential (Vcc/2 − α) which is lower than a potential (Vcc/2) to be originally taken because of influence of the capacitance of a load to which the potential Vout is to be applied or the like. In such a case, transistor 4 is brought to ON state, so that in FIG. 9, a channel is formed between one N+ region 200 and the other N+ region 300. This causes an insulating film (not shown) under gate electrode 400 to function as a capacitor which receives the potential of node N1 at one electrode and receives the potential of the channel at another electrode. The potential of the channel is between the potential of N+ region 200, i.e. the potential Vout (Vcc/2 − α) of node N3, and the potential of N+ region 300, i.e., the supply potential Vcc.

On the other hand, if the potential Vout of node N3 becomes a potential (Vcc/2 + α) which is higher than the potential (Vcc/2) to be originally taken, transistor 4 is brought to OFF state, so that in FIG. 9, no channel is formed between N+ regions 200 and 300. Accordingly, in such a case, the insulating film under the gate electrode 400 operates as a capacitor which receives the potential of node N1 at one electrode and receives the potential of P well 100 at another electrode. P well 100 is biased to approximately −3 V by a substrate bias circuit or the like, for example, (in a case where the supply potential Vcc is 5 V).

Accordingly, the capacitance between the gate of transistor 4 and the drain of transistor 4 is changed by the switching operation of transistor 4 due to fluctuations in the potential Vout of node N3, so that a charge and discharge current for the capacitance between the gate and drain flows between node N1 and the gate of transistor 4. As a result, the potential of transistor 4 fluctuates from the potential (Vcc/2 + Vthn) to be originally taken. Such a phenomenon occurs in transistor 5 as well.

Specifically, if the potential Vout of node N3 is higher than the potential (Vcc/2) to be originally taken, transistor 5 is brought to ON state, so that in FIG. 10, a channel is formed between P+ regions 600 and 700. Therefore, an insulating film (not shown) under gate electrode 800 operates as a capacitor which receives the potential of node N1 at one electrode and receives the potential of the channel at another electrode. In such a case, the potential of the channel is between the potential of P+ region 600, i.e. the ground potential 0 V, and the potential of P+ region 700, i.e. the potential Vout Vcc/2 + α) of node N3.

On the other hand, if the potential Vout of node N3 is lower than the potential (Vcc/2) to be originally taken, transistor 5 is in OFF state, so that no channel is formed between P+ regions 600 and 700. Therefore, the insulating film under gate electrode 800 operates as a capacitor which receives the potential of node N1 at one electrode and receives the potential of N well 500 at another electrode. N well 500 is normally biased to approximately 5 V (in a case where the supply potential Vcc is 5 V).

Accordingly, the switching operation of transistor 5 due to the fluctuations in the potential Vout of node N3 changes the capacitance between the gate and drain of transistor 5. Therefore, a charge and discharge current for the capacitance between the gate and the drain flows between node N2 and the gate of transistor 5, so that the gate potential of transistor 5 fluctuates from the potential (VCc/2 − Vthp) to be originally taken.

As described above, if the gate potentials of transistors 4 and 5 fluctuate, the potential of node N3 also fluctuates, so that a correct potential (Vcc/2) is not provided from the half Vcc generating circuit. In order to avoid such a problem, it is necessary to increase the current flowing from the supply terminal Tcc through resistors 1–3 to the ground GND so that the current flowing between node N1 and the gate of transistor 4 for charging and discharging of the capacitance between the gate and drain of transistor 4 and the current flowing between node N2 and the gate of transistor 5 for charging and discharging of the capacitance between the gate and drain of transistor 5 are sufficiently smaller as compared with the current flowing from the supply terminal Tcc through resistors 1–3 to the ground GND.

If the current flowing from the supply terminal Tcc through resistors 1–3 to the ground GND is sufficiently larger than such a charge and discharge current, the potential of node N1 is not fluctuated so largely by the current flowing from node N1 to the gate of transistor 4 and the current flowing from the gate of transistor 4 to node N1, and, similarly, the potential of node N2 is not fluctuated so largely by the current flowing from node N2 to the gate of transistor 5 and the current flowing from the gate of transistor 5 to node N2.

However, increase in the current flowing from the supply terminal Tcc to the ground GND, i.e. the through current, leads to further increase in the power consumption.

As described above, a voltage generating circuit of such a structure as representated by the conventional half Vcc generating circuit has a problem that it is disadvantageous to the realization of low power consumption and large scale integration.

Now, problems of the latter voltage generating circuit will be described with reference to the substrate bias circuit in FIG. 11.

The latter voltage generating circuit is constructed so that negative charge is discharged from capacitor 6 in a constant cycle to turn on diode-connected MOS transistor 7 provided for supplying the discharged negative charge to a semiconductor substrate. Therefore, the output voltage $V_{BB}$ of a substrate bias circuit is limited to a voltage $(-V_{cc}+V_{thp})$ which is higher than a negative voltage having the same absolute value of that of a signal for charging capacitor 6, i.e. the maximal voltage level Vcc of an output signal of inverter 5, by the threshold voltage Vthp of MOS transistor 7. Therefore, according to the conventional substrate bias circuit, it is impossible to bias the semiconductor substrate to an arbitrary potential.

Specifically, it is only possible to adjust the substrate bias voltage only by adjusting the threshold voltage Vthp of the MOS transistor. The threshold voltage Vthp of the MOS transistor is nearly 0.8 V, and it cannot be changed so largely even by adjusting conditions of manufacture of the MOS transistor or the like. Therefore, in a semiconductor integrated circuit device in which the supply potential Vcc is 5 V, for example, the substrate bias voltage $V_{BB}$ is specified to be nearly $-4.2$ V.

However, recently, it is proposed to use a supply potential Vcc of approximately 3 V, which is lower than 5 V, and to bias the semiconductor substrate to a negative potential higher than in the case of conventional devices in order to further enhance the operating speed of the semiconductor integrated circuit device. The operating speed of the semiconductor integrated circuit device is known to become slower as the semiconductor substrate is biased to a lower negative potential. However, it is impossible to avoid such problems as described above unless the semiconductor substrate is biased to a potential which is low to a certain extent.

For example, in a semiconductor integrated circuit device in which the supply voltage is 5 V, if the substrate bias voltage $V_{BB}$ is lowered to nearly $-4.2$ V, it is difficult to further enhance the operating speed of the device.

Accordingly, in order to avoid such problems and further enhance the operating speed of the device as well, it is currently proposed to set the supply voltage Vcc to about 3 V and set the substrate bias voltage $V_{BB}$ to about $-1.5$ V, for example.

However, according to the conventional substrate bias generating circuit, the substrate bias voltage $V_{BB}$ is limited to $-3$ V$+0.8$ V, i.e. about $-2.5$ V.

As described above, according to the latter voltage generating circuit, its output voltage is determined almost uniquely by the supply voltage Vcc, so that it is difficult to further enhance the operating speed of a semiconductor integrated circuit device.

SUMMARY OF THE INVENTION

An object of the present invention is to provide a voltage generating device with small power consumption.

Another object of the present invention is to provide a voltage generating device in which irregularities in electric characteristics of its components occurring in a manufacturing process do not incur increase in the power consumption.

Still another object of the present invention is to provide a voltage generating device which does not inhibit large scale integration of a semiconductor integrated circuit device when incorporated in the semiconductor integrated circuit device.

A further object of the present invention is to provide a voltage generating device in which fluctuations in an output voltage are mitigated.

A further object of the present invention is to provide a voltage generating device which is advantageous for enhancing the operating speed of a semiconductor integrated circuit device.

A further object of the present invention is to provide a voltage generating device in which an output voltage can be set to an arbitrary value.

A further object of the present invention is to provide a voltage generating device which is advantageous for large scale integration and capable of generating a voltage at an arbitrary level with small power consumption.

In order to achieve the objects as described above, according to an aspect, a voltage generating device of the present invention is a voltage generating device for supplying a constant voltage to a predetermined load, which includes first and second capacitor elements connected in series with each other, first connection circuitry for electrically connecting the connection point between the first and second capacitor elements to a first potential source supplying a constant potential, second connection circuitry for electrically connecting the connection point to a predetermined load, and first and second connection control circuitry for controlling the first and second connection circuitry, respectively.

The first and second capacitor elements are coupled between the first potential source and a second potential source which supplies a potential changing from a first level to a second level in a constant cycle. The first connection circuitry is deactivated in timing earlier than the switching of the potential of the second potential source from the first level to the second level and activated in timing later than the switching of the potential of the second potential source from the second level to the first level. The second connection circuitry is activated in timing later than the switching of the potential of the second potential source from the first level to the second level and deactivated in timing earlier than the switching of the potential of the second potential source from the second level to the first level.

The first and second capacitor elements and the first and second connection circuitry are preferably formed on the same semiconductor substrate.

Since the voltage generating device according to the present invention is constructed as described above, positive charge or negative charge is accumulated in the connection point between the first capacitor element and the second capacitor element by a charging operation or a discharging operation of the first and second capacitor elements in response to the switching of the second potential source from the first level to the second level, and thus the potential of that connection point becomes a potential determined uniquely in accordance with the ratio of the value of the capacitance of the first capacitor element to the value of the capacitance of the second capacitor element and the difference voltage between the potential at the second level of the second potential source and the constant potential of the first potential source. Every time the connection point attains such a potential, the charge accumulated in the connection point is supplied to the predetermined load by activated second connection circuitry. Accordingly, the potential determined uniquely by the ratio of the value of the capacitance of the first capacitor element to the value of the capacitance of the second capacitor element and the difference voltage between the potential at the second level of the second potential source and the constant potential of the first potential source is always applied to the predetermined load.

If the first and second capacitor elements and the first and second connection circuitry are formed on the same semiconductor substrate, the voltage generating device according to the present invention can be used as a circuit to be contained in a semiconductor integrated circuit device.

According to another aspect, the present invention is applied to a semiconductor memory device, and the semiconductor memory device according to the present invention includes a plurality of memory cells arranged in a plurality of columns and formed on the same substrate, a plurality of bit lines provided corresponding to the plurality of columns and each connected, in common, to all the memory cells arranged in a corresponding one of the columns, first and second input/output lines for transmitting data to be written into one of the plurality of memory cells and data to be read from one of the plurality of memory cells from the outside and to the outside, respectively, circuitry for writing data on the first and second input/output lines into one of the plurality of memory cells and for reading data from one of the plurality of memory cells onto the first and second input/output lines, control circuitry for controlling the circuitry for writing and reading data, and precharge voltage generating circuitry for generating a constant voltage for precharging the substrate, the plurality of bit lines, and the first and second input/output lines to a predetermined potential of a positive polarity.

The precharge voltage generating circuitry includes the first and second capacitor elements, the first and second connection circuitry, and the first and second connection control circuitry as described above. According to this aspect, loads to be electrically connected to the connection point between the first and second capacitor elements by the second connection circuitry are the substrate, the plurality of bit lines, and the first and second input/output lines, the capacitance of the first capacitor element is equal to the capacitance of the second capacitor element, first and second levels are set to a low level and a high level, respectively, and the constant voltage is set to a low level. With this construction, it si possible to realise a semiconductor memory device in which adverse effects due to the power consumption, the occupied area, and fluctuations in an output potential of a circuit for precharging the substrate, the plurality of bit lines, and the first and second input/output lines to a potential (Vcc/2) which is half a supply potential Vcc corresponding to the high level are eliminated.

According to still another aspect, a semiconductor memory device of the present invention includes a plurality of memory cells, a plurality of bit lines, first and second input/output lines, circuitry for writing and reading data, control circuitry, and precharge voltage generating circuitry, which are as described above, and substrate bias generating means which generates a negative voltage for biasing a semiconductor substrate on which at least the plurality of memory cells, the plurality of bit lines, the first and second input/output lines, the circuitry for writing and reading data, and the control circuitry are formed.

The substrate bias generating circuitry has basically the same structure as the structure of the precharge voltage generating circuitry. However, in the substrate bias generating circuitry, the first level and the second level are set to a high level and a low level, respectively, and the load to be connected to the connection point between the first capacitor element and the second capacitor element by the second connection circuitry is set to the semiconductor substrate. With this construction, it is possible to realize a semiconductor memory device in which adverse effects due to the power consumption, the occupied area, and fluctuations in an output potential of any "the circuitry for precharging" and the circuitry for biasing the semiconductor substrate to a negative potential as described above are eliminated.

Preferably, this semiconductor memory device externally receives a predetermined control signal, the control circuitry controls the circuitry for writing and writing data in response to the predetermined control signal, and the first and second connection control circuitry of each of the precharge voltage generating circuitry and the substrate bias voltage generating circuitry includes oscillation circuitry having a constant cycle of oscillation, selection circuitry for selecting either an output signal of the oscillation circuitry or the predetermined control signal, and generation circuitry for generating first and second signals for controlling the first and second connection circuitry, respectively, in response to the signal selected by the selection circuitry.

According to a further aspect, the present invention is applied to semiconductor integrated circuit devices in general, and the semiconductor integrated circuit device of the present invention includes function circuitry for realizing a predetermined function and substrate bias voltage generating circuitry for generating a voltage for biasing a semiconductor substrate on which the function circuitry is formed to a predetermined potential.

According to this aspect, the substrate bias voltage generating circuitry also has the same structure as the structure of the above-described voltage generating device and is connected to the semiconductor substrate by second connection circuitry. With this construction, it is possible to control the characteristics of circuitry elements or the like satisfactory by holding the potential of the semiconductor substrate to a desired potential without incurring increase in the power consumption.

According to a still further aspect, the present invention is applied to an operating method of a voltage generating device for generating a constant voltage to be applied to a predetermined load which includes first and second capacitor means connected in series with each other and coupled between a first potential source supplying a constant potential and a second potential source supplying a potential changing from a first level to a second level in a constant cycle, and the operating method includes the step of electrically separating the connection point between the first capacitor circuitry and the second capacitor circuitry from the first potential source in timing earlier than the switching of the potential of the second potential source from the first level to the second level, the step of electrically connecting the connection point and the first potential source in timing later than the switching of the potential of the second potential source from the second level to the first level, the step of electrically connecting the connection point and the predetermined load in timing later than the switching of the potential of the second potential source from the first level to the second level, and the step of electrically separating the connection point and the predetermined load in timing earlier than the switching of the potential of the second potential source from the second level to the first level.

As described above, according to the present invention, it is possible to obtain a voltage generating device capable of generating an arbitrary potential with small power consumption. Therefore, if the voltage generating device according to the present invention is applied to a half Vcc generating circuit contained in a semiconductor integrated circuit device, for example, it is possible to reduce the power consumption of the semiconductor memory device and the occupied area of the half Vcc generating circuit. Additionally, if the voltage generating device according to the present invention is applied to a substrate bias circuit contained in a semiconductor integrated circuit device, it is possible to bias a semiconductor substrate to a desired potential, so that it is also possible to further enhance the operating speed of the semiconductor integrated circuit device.

Accordingly, it is possible to further reduce the power consumption and further enhance the operating speed of an electronic circuit device by using the voltage generating device according to the present invention.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a circuit diagram illustrating a general structure of a providing circuit in a conventional semiconductor memory device or the like.

DESCRIPTION OF THE PREFERRED EMBODIMENTS

Figure 1:
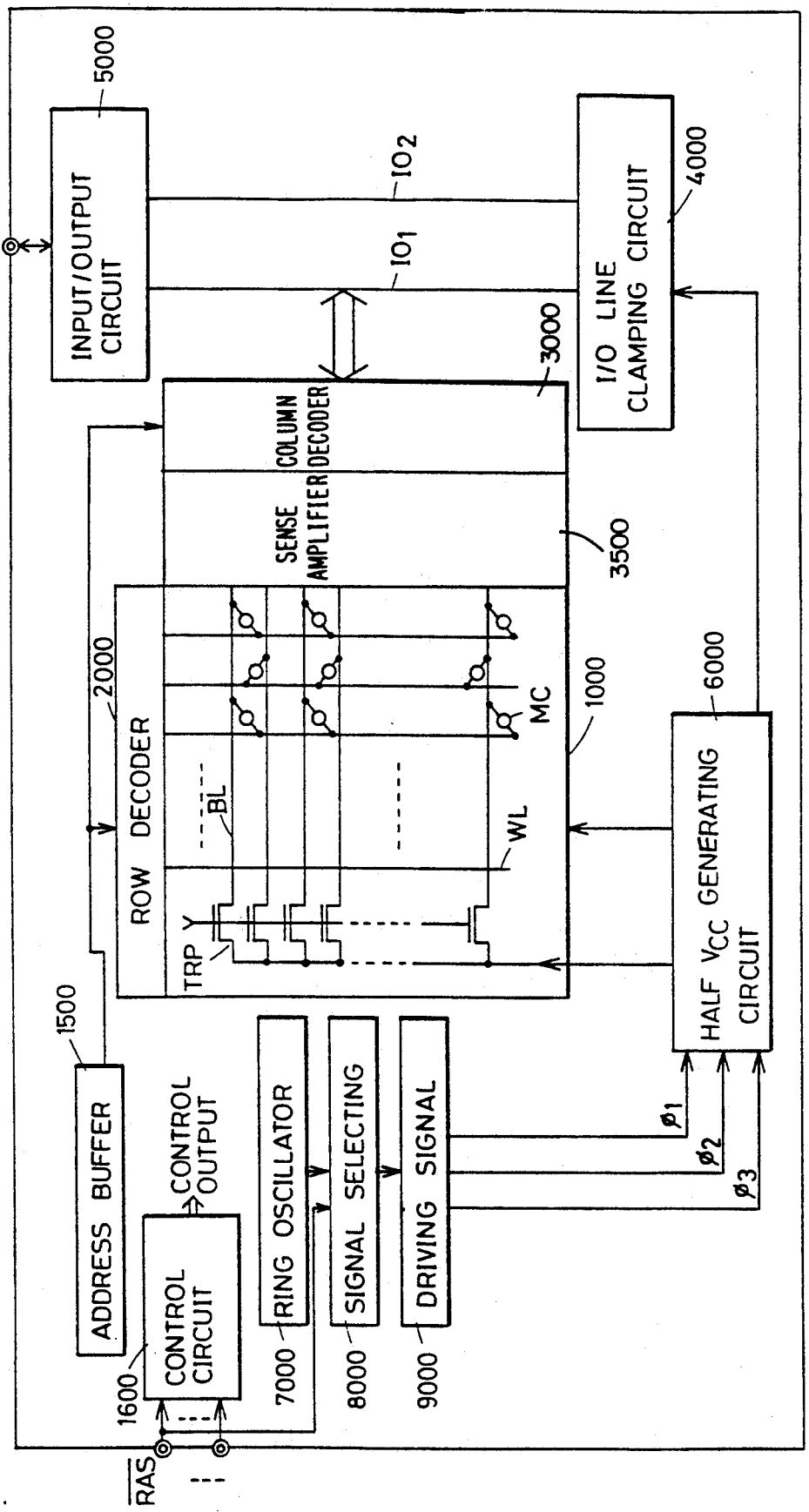
FIG. 1 is a schematic block diagram illustrating the whole configuration of a DRAM according to an embodiment of the present invention.

FIG. 1 is a schematic block diagram illustrating the whole configuration of a DRAM according to an embodiment of the present invention. In this embodiment, a voltage generating circuit according to the present invention is used as a half Vcc generating circuit.

Figure 8:
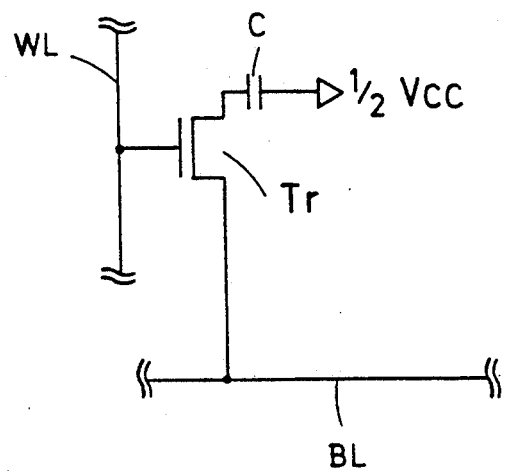
FIG. 8 is a circuit diagram illustrating a structure of a memory cell of a DRAM.
Figure 9:
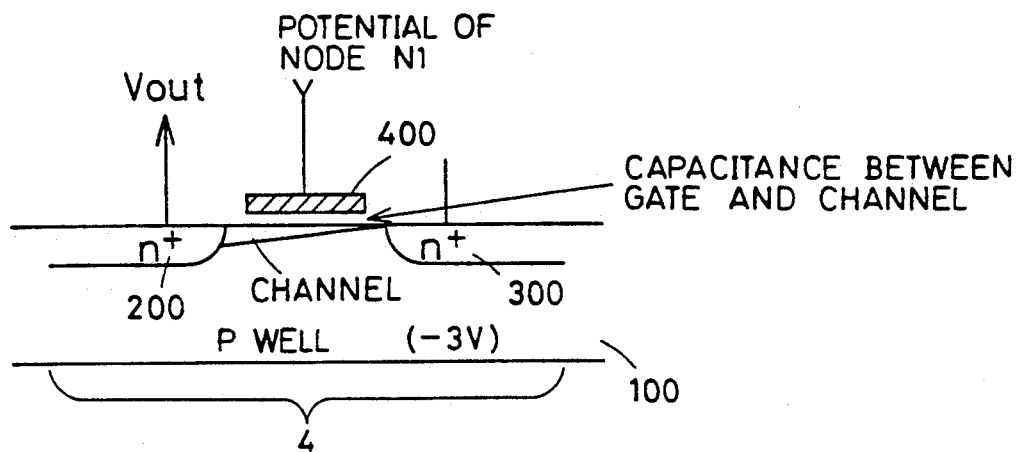
FIG. 9 is a cross sectional view illustrating a structure of an N-channel MOS transistor in FIG. 7.
Figure 10:
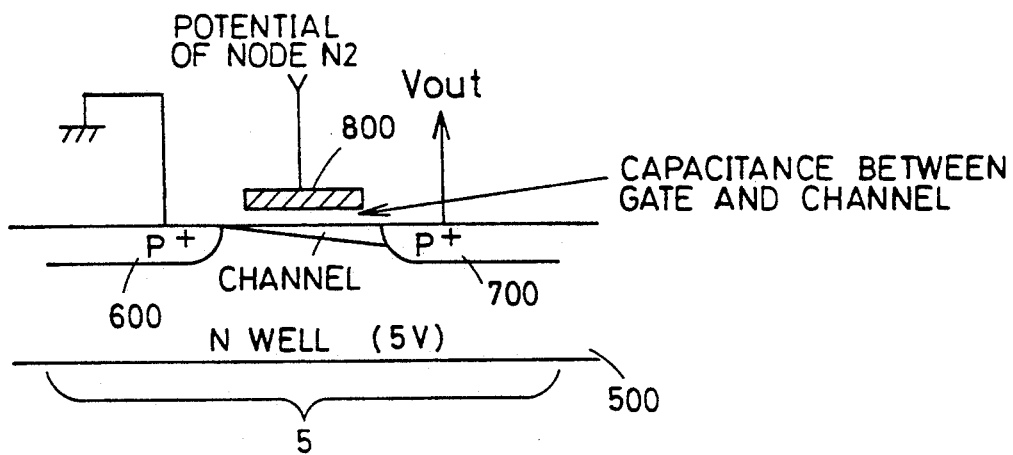
FIG. 10 is a cross sectional view illustrating a structure of a P-channel MOS transistor 5 in FIG. 7.
Figure 11:
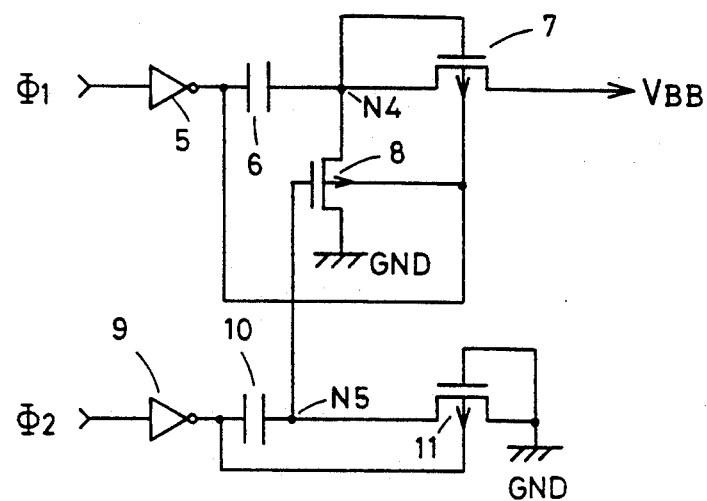
FIG. 11 is a circuit diagram illustrating a structure of a conventional substrate bias circuit.
Figure 12:
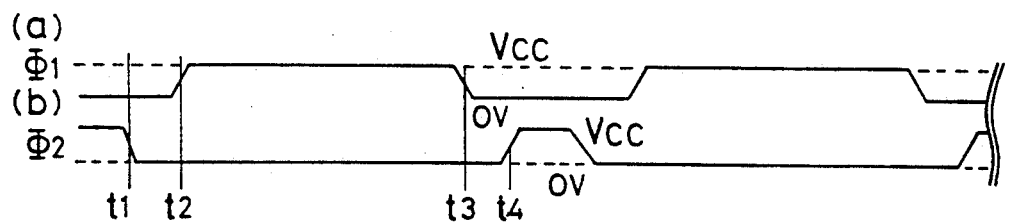
FIG. 12 is a timing chart showing waveforms of driving signals $\Phi 1$, $\Phi 2$ to be supplied to the substrate bias circuit in FIG. 11.
Figure 13:
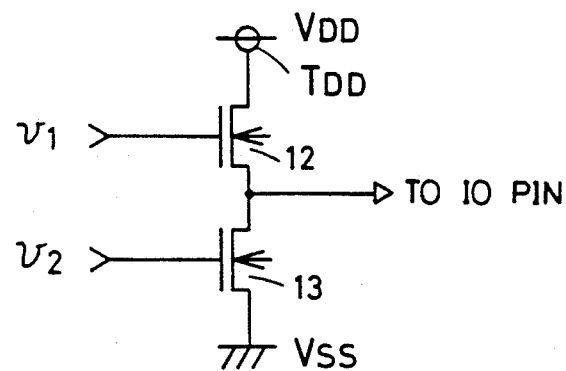
Figure 14:
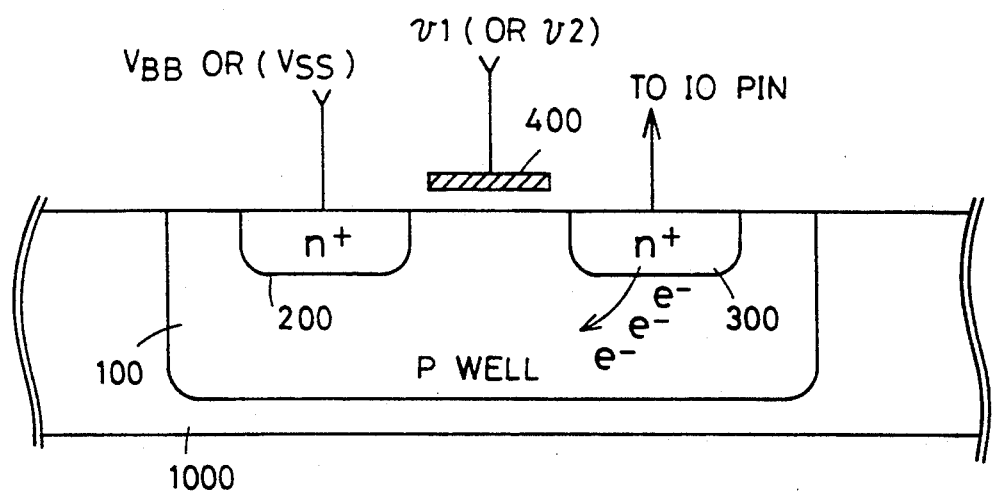
FIG. 14 is a cross sectional view for explaining an example of problems arising in a case where a semiconductor substrate is not biased to a negative potential.
Figure 15:
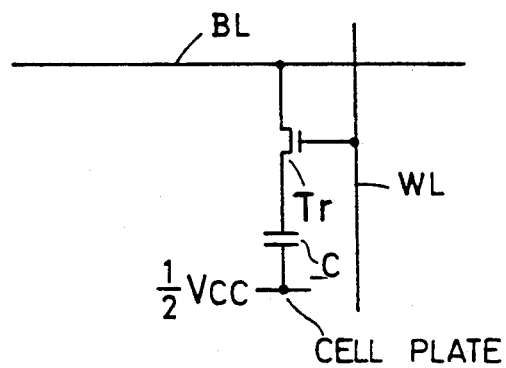
FIG. 15 is a circuit diagram for explaining another example of problems arising in a case where a semiconductor substrate is not biased to a negative potential.

A memory cell array 1000 includes a plurality of memory cells MC arranged in a plurality of rows and a plurality of columns and each having a structure illustrated in FIG. 8. The memory cells MC arranged in the same row are connected to the same word line WL, and the memory cells MC arranged in the same column are connected to the same bit line BL. Each bit line BL is connected through a precharge control transistor TRP to a half Vcc generating circuit 6000. An output voltage of half Vcc generating circuit 6000 is applied to a cell plate connected, in common, to one electrode of a capacitor C of each of the memory cells MC, all the precharge transistors TRP, and an I/O line clamping circuit 4000.

All the precharge control transistors TRP are controlled in the lump by control circuit 1600, brought to ON state to supply an output voltage of half Vcc generating circuit 6000 to a corresponding one of the bit lines BL, in a period in which neither writing of data nor reading of data is performed. This causes each bit line BL to be precharged to a potential (Vcc/2) which is half a supply potential Vcc in such a period.

I/O line clamping circuit 4000 clamps the potentials of the two I/O lines IO1, IO2, which transmit signals complementary to each other corresponding to data in reading of the data and writing of the data, with an output voltage of half Vcc generating circuit 6000 in a period in which neither writing of data nor writing of data is performed. This causes I/O lines IO1, IO2 to be precharged to a potential Vcc/2 which is half the supply potential Vcc in a period in which neither reading of data nor writing of data is performed.

An address buffer 1500 buffers an externally applied address signal and applies it to a row decoder 2000 and a column decoder 3000.

Row decoder 2000 decodes the applied address signal so as to make only one of the word lines WL attain the potential of a high level in reading of data and writing of data. This enables writing and reading of data only into/from the memory cells MC in one row connected to the one word line WL.

In reading of data, a sense amplifier 3500 amplifies a change in the potential of each bit line BL.

In reading of data, column decoder 3000 transmits signals complementary to each other in accordance with a signal obtained from one of the bit lines BL out of signals amplified by sense amplifier 3500 to input-/output lines IO1 and IO2 in response to the applied address signal. In writing of data, column decoder 3000 applies a voltage at a level in accordance with the potentials I/O lines IO1 and IO2 to one of the bit lines BL in response to the applied address signal.

In writing of data, input/output circuit 5000 forces I/O lines IO1 and IO2 to have potentials complementary to each other in accordance with external data, and, in reading of data, input/output circuit 5000 provides data in accordance with the potentials complementary to each other of I/O lines IO1 and IO2 to the outside.

Control circuit 1600 controls operations of these circuits in response to an external control signal such as a row address strobe signal RAS or the like.

Unlike the conventional device, half Vcc generating circuit 6000 is controlled by three driving signals $\phi1$-$\phi3$ to operate in this embodiment.

Figure 2:
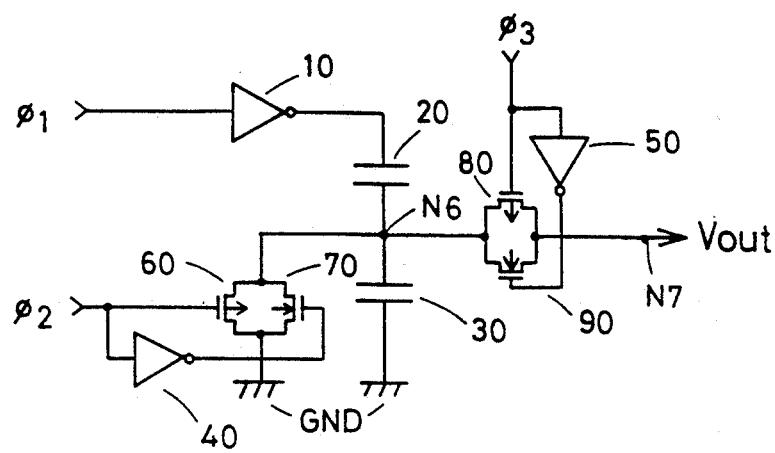
FIG. 2 is a schematic diagram illustrating a structure of a half Vcc generating circuit in FIG. 1.
Figure 3:
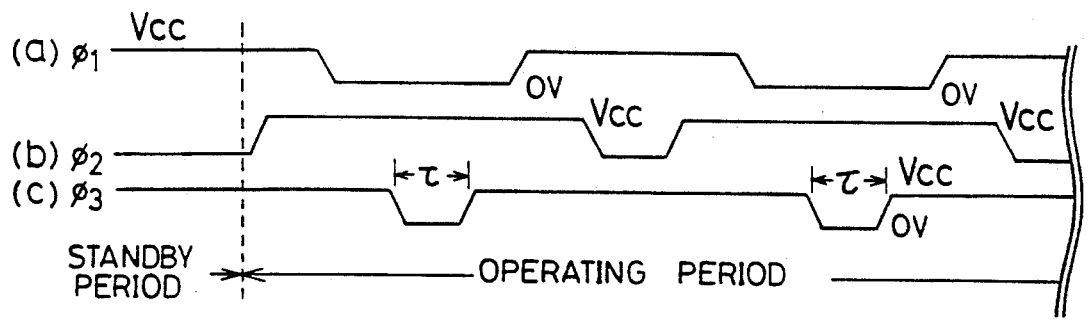
FIG. 3 is a timing chart showing waveforms of driving signals $\phi 1-\phi 3$ to be supplied to a half Vcc generating circuit in FIG. 2.

FIG. 2 is a circuit diagram illustrating a structure of half Vcc generating circuit 6000. FIG. 3 is a timing chart showing changes in the potentials of driving signals $\phi1$-$\phi3$ in a period in which half Vcc generating circuit 6000 should operate.

The structure and operation of half Vcc generating circuit 6000 according to this embodiment will be described in the following with reference to FIGS. 2 and 3.

The half Vcc generating circuit includes an inverter 10 for inverting driving signal $\phi1$, two capacitors 20, 30 connected in series with each other between an output terminal of inverter 10 and ground GND, an inverter 40 for inverting driving signal $\phi2$, and an inverter 50 for inverting driving signal $\phi3$.

This half Vcc generating circuit further includes a P-channel MOS transistor 60 and an N-channel MOS transistor 70, which are connected in parallel with each other between the connection point (a node N6) between capacitors 20 and 30 and ground GND, and P-channel MOS transistor 80 and an N-channel MOS transistor 90, which are connected in parallel with each other between node N6 and an output terminal (a node N7) of the half Vcc generating circuit. Driving signal $\phi2$ and an output signal of inverter 40 are applied to the gates of transistors 60 and 70, respectively. Driving signal $\phi3$ and an output signal of inverter 50 are applied to the gates of transistors 80 and 90, respectively.

In a period in which the half Vcc generating circuit should not operate (this period will be hereinafter referred to as a standby period), driving signals $\phi1$, $\phi2$ and $\phi3$ are fixed to a supply potential Vcc corresponding to a high level, a ground potential 0 V corresponding to a low level, and a potential Vcc of the high level, respectively, as shown in FIGS. 3 (a), (b) and (c).

Accordingly, in the standby period, transistors 60 and 70 are both in ON state to ground node N6, and transistors 80 and 90 are both in OFF state to electrically separate node N6 from output terminal N7. Furthermore, in this period, the output potential of inverter 10 is at the low level, so that neither capacitor 20 nor capacitor 30 is charged.

In a period in which the half Vcc generating circuit should operate (this period will be hereinafter referred to as an operating period), first, driving signal $\phi2$ (FIG. 3 (b)) rises to the high level. This causes transistors 60 and 70 to be both brought to OFF state so as to electrically separate node N6 from ground GND to bring it to a floating state.

Next, driving signal $\phi1$ falls to the low level. This causes the output potential of inverter 10 to attain the high level, so that capacitors 20 and 30 are charged, and the potential of node N6 becomes a potential which is determined by the ratio of the capacitance of capacitor 20 to the capacitance of capacitor 30.

In a case where a serial connection circuit of a plurality of capacitors is supplied with a certain voltage V with one end of the serial connection circuit grounded, if the capacitance of the plurality of capacitors is expressed by C1, C2, ..., Cn, from the capacitor on the side close to the ground, the potential of the connection point between the jth capacitor from the side of the ground and the (j+1)th capacitor from the side of the ground is expressed by the following expression (j<n).

V (C1+C2+ ... +Cj)/(C1+C2+ ... +Cn)

Accordingly, if the capacitance of capacitors 20 and 30 are expressed by $C_{20}$ and $C_{30}$, respectively, the potential of node N6 is expressed by the following expression.

$Vcc \cdot C_{30}/(C_{20}+C_{30})$

In this embodiment, the capacitance $C_{20}$ of capacitor 20 and the capacitance $C_{30}$ of capacitor 30 are set to be equal so that the value of the above expression becomes Vcc/2.

Then, driving signal $\phi3$ (FIG. 3 (c)) attains the low level. This causes both of transistors 80 and 90 to be brought to ON state to electrically connect node N6 to output terminal N7. As a result, charge accumulated in node N6 is supplied to node N7, and the potential of node N6 before transistors 80 and 90 are switched to ON state, i.e., Vcc/2, appears onto node N7. Specifically, the potential of Vcc/2 is supplied from the half Vcc generating circuit to the cell plate, the precharge control transistor TRP, and I/O line clamping circuit 4000 (See FIG. 1.).

Then, driving signal $\phi3$ returns to the high level again. This causes both of transistors 80 and 90 to be brought to OFF state, so that node N6 returns to the floating state.

Then, driving signal $\phi1$ returns to the high level. This causes the output potential of inverter 10 to attain the low level, so that capacitors 20 and 30 are both discharged Then, driving signal $\phi2$ returns to the low level. This causes transistors 60 and 70 to be brought to ON state, so that charge is completely pulled out of node N6 and the potential of node N6 becomes the ground potential 0 V.

Thereafter, in the operating period, a series of changes in the potentials of driving signals $\phi1$-$\phi3$ as described above is repeated to cause positive charge of an amount corresponding to the potential of Vcc/2 to be supplied from node N6 through transistors 80 and 90 to predetermined circuits in a constant cycle.

Thus, in this half Vcc generating circuit, charging of capacitors 20, 30 connected in series with each other, transfer of charge accumulated in the connection point N6 between the capacitors to output terminal N7, cutting off of the electrical connection between the connection point N6 and output terminal N7, and initialization of the potential of connection point N6 are performed repeatedly to cause the potential Vout of output terminal N7 to be fixed at the potential of connection point N6 in the state wherein capacitors 20, 30 are charged completely.

According to the above embodiment, the period between the time when charge accumulated in node N6 starts to be transferred to output terminal N7 and the time when node N6 is electrically separated from output terminal N7 in order to charge capacitors 20, 30 completely again, i.e. a period $\tau$ in FIG. 3 (c), is set in accordance with a sum of the capacitances of loads such as the bit lines BL, I/O lines IO1, IO2, the cell plate, or the like which are to be supplied with an output voltage of the half Vcc generating circuit.

Specifically, charge supplied from node N6 through transistors 80, 90 to these loads in response to the rise of driving signal $\phi 3$ is consumed in the loads, so that the output potential Vout of the half Vcc generating circuit is lowered gradually from the potential Vcc/2 to be originally taken. Therefore, driving signal $\phi 3$ is raised to the high level in such timing that capacitors 20 and 30 are charged completely again to accumulate charge of an amount corresponding to Vcc/2 in node N6 before the output potential Vout is lowered significantly from Vcc/2.

Figure 7:
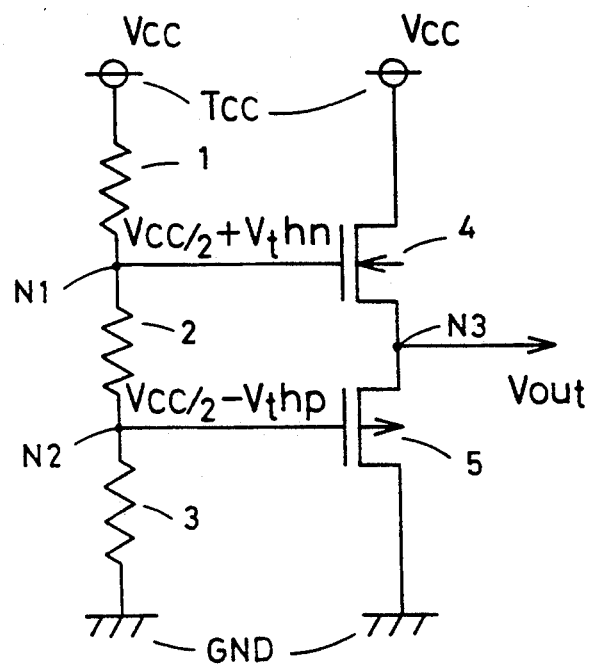
FIG. 7 is a circuit diagram illustrating a structure of a conventional half Vcc generating circuit.

In a case where the capacitance of the load is large, it is necessary to increase the capacitance of capacitors 20 and 30 to increase the amount of charge to be supplied from node N6 to the loads. A capacitor formed on a semiconductor substrate has larger capacitance as its area is larger. Accordingly, in a case where the capacitance of the loads is large, the layout areas of the capacitors 20, 30 on the semiconductor substrate become larger. However, the layout area of a capacitor on a semiconductor substrate is sufficiently smaller than that of a diffusion resistor on a semiconductor substrate. Therefore, even if the capacitance of capacitors 20, 30 is set to be somewhat large, the layout areas of capacitors 20, 30 are sufficiently smaller as compared with the layout areas of resistor elements 1-3 on the semiconductor substrate in the conventional half Vcc generating circuit (See FIG. 7.).

According to the above embodiment, a transfer gate for transferring charge between node N6 in which charge of an amount corresponding to a desired potential Vcc/2 is to be accumulated repeatedly and loads as described above and a transfer gate provided between node N6 and the ground GND for initializing the potential of node N6 both employ a parallel connection circuit of a P-channel MOS transistor and an N-channel MOS transistor. However, it is also possible to use only one of a P-channel MOS transistor and an N-channel MOS transistor as such a transfer gate. Specifically, such a transfer gate may employ any types of switching elements which are capable of controlling ON/OFF so that electrical connection/cutting between node N6 and the ground GND and between node N6 and output terminal N7 is performed in such timing as described in the above embodiment.

As described above, unlike the conventional half Vcc generating circuit, the half Vcc generating circuit according to this embodiment does not require a serial connection circuit (See FIG. 7.) of a plurality of resistor elements 1-3 provided between a supply terminal Tcc and ground GND for obtaining a desired potential Vcc/2, and potential is supplied to a predetermined load by supplying charge accumulated by charging capacitors 20, 30 to the load. Therefore, according to the half Vcc generating circuit of this embodiment, the through current in operation is largely reduced as compared with that of the conventional half Vcc generating circuit, and increase in the layout area due to the resistor elements is avoided.

Furthermore, the half Vcc generating circuit according to this embodiment does not utilize the switching operation of a MOS transistor for holding a predetermined node N6 to a desired potential Vcc/2, unlike the case of the conventional half Vcc generating circuit. Therefore, the problem conventionally caused due to fluctuations in the gate potential of the MOS transistor does not arise in the half Vcc generating circuit according to this embodiment.

Driving signals $\phi 1-\phi 3$ may be supplied from the outside of the DRAM or generated inside the DRAM. FIG. 1 illustrates a case where driving signals $\phi 1-\phi 3$ are generated inside the DRAM.

Referring to FIG. 1, a circuit 7000 for generating a signal whose level is inverted in a constant cycle, a ring oscillator, for example, a signal selecting circuit 8000 for selecting either an output signal of circuit 7000 or an external control signal designating inhibition/permission of a circuit operation of the DRAM, a row address signal RAS, for example, and a driving signal generating circuit 9000 operating on the basis of the signal selected by signal selecting circuit 8000 are provided for driving signals $\phi 1-\phi 3$.

In a period in which the external control signal designates inhibition of the circuit operation of the DRAM, signal selecting circuit 8000 selects that external control signal, and, in a period in which the external control signal designates permission of the circuit operation of the DRAM, signal selecting circuit 8000 selects the output signal of circuit 7000.

In a period in which the external control signal is selected by signal selecting circuit 8000, driving signal generating circuit 9000 fixes driving signals $\phi 1-\phi 3$ to the potentials in the standby period in FIG. 3, respectively, on the basis of the external control signal, and, in a period in which the output signal of circuit 7000 is selected by signal selecting circuit 8000, driving signal generating circuit 9000 generates driving signals $\phi 1-\phi 3$ the potentials of which change in the operating period in FIG. 3 in response to the output signal of circuit 7000.

Figure 4:
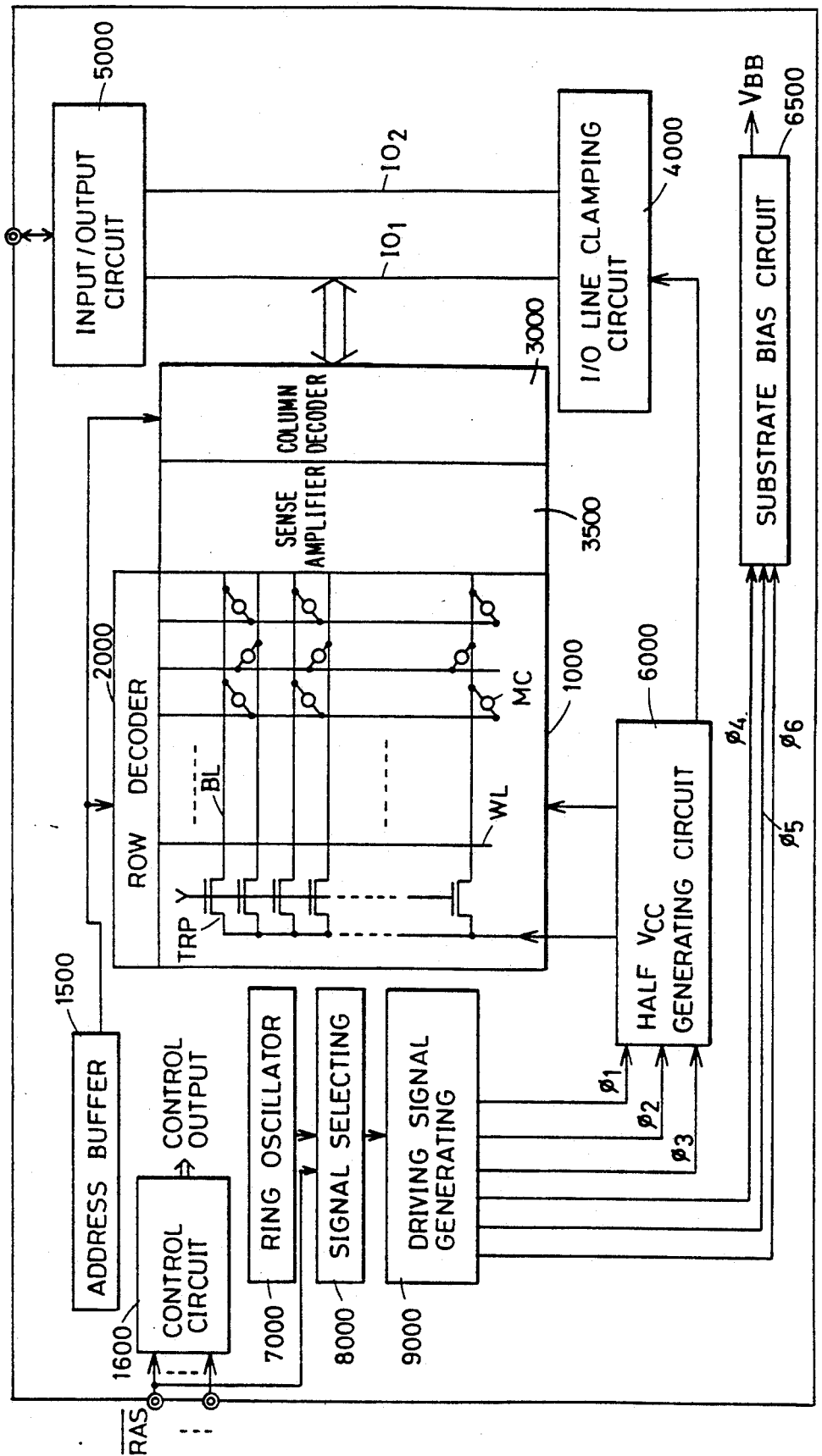
FIG. 4 is a schematic block diagram illustrating the whole configuration of a DRAM according to another embodiment of the present invention.

FIG. 4 is a schematic block diagram illustrating the whole configuration of a DRAM according to another embodiment of the present invention. In this embodiment, a voltage generating circuit according to the present invention is used not only in half Vcc generating circuit 6000 but also in substrate bias generating circuit 6500.

The structure and operation of parts other than substrate bias generating circuit 6500 of the DRAM according to this embodiment are the same as those in the case of the embodiment illustrated in FIG. 1, so that description of them will not be repeated. However, unlike the case of the embodiment illustrated in FIG. 1, driving voltage generating circuit 9000 also generates driving signals $\phi 4-\phi 6$ for substrate bias circuit 6500 in addition to driving signals $\phi 1-\phi 3$ for half Vcc generating circuit 6000.

The structure and operation of substrate bias circuit 6500 according to this embodiment will be described with reference to FIGS. 5 and 6.

Figure 5:
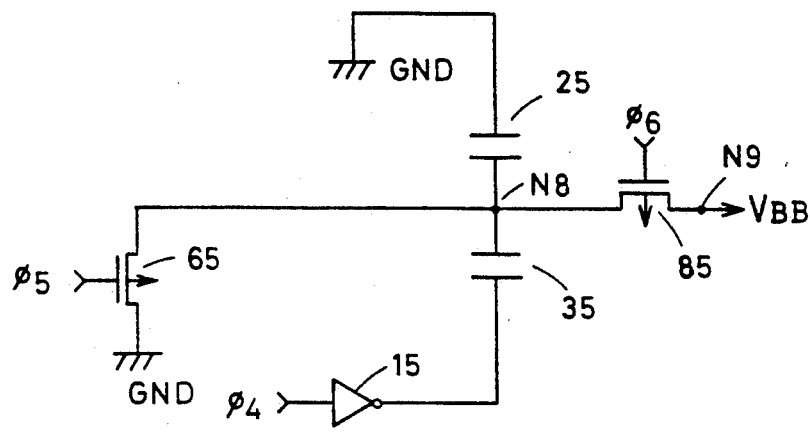
FIG. 5 is a circuit diagram illustrating a structure of a substrate bias circuit in FIG. 4.
Figure 6:
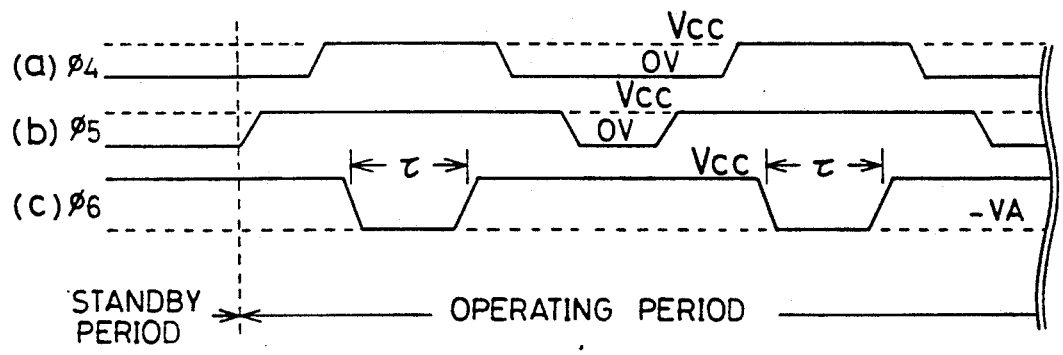
FIG. 6 is a timing chart showing waveforms of driving signals $\phi 4-\phi 6$ to be supplied to the substrate bias circuit in FIG. 5.

FIG. 5 is a circuit diagram illustrating a structure of substrate bias circuit 6500. FIG. 6 is a timing chart showing changes in the potentials of driving signals $\phi 4-\phi 6$ in the operating period of substrate bias circuit 6500.

Substrate bias circuit 6500 includes an inverter 15 which inverts driving signal $\phi 4$, two capacitors 25, 35 connected in series with each other between an output terminal of inverter 15 and ground GND, P-channel MOS transistor 65 provided between the connection point (a node N8) between capacitors 25 and 35 and the ground GND, and a P-channel MOS transistor 85 provided between node N8 and a node N9 connected to a semiconductor substrate (not shown) on which the DRAM is formed.

Driving signals $\phi 5$ and $\phi 6$ are applied to the gates of transistors 65 and 85, respectively.

In the standby period of substrate bias circuit 6500, driving signals $\phi 4$ (FIG. 6(a)), $\phi 5$ (FIG. 6(b)) and $\phi 6$ (FIG. 6(c)) are fixed to a low level, the low level, and a high level, respectively. Accordingly, in the standby period, transistor 65 is in ON state while transistor 85 is in OFF state, so that node N8 is at the ground potential 0 V. The output potential of inverter 15 is at the high level, so that capacitor 35 is in a charged state.

If substrate bias circuit 6500 enters the operating period, first, driving signal $\phi 5$ attains the high level. This causes transistor 65 to be brought to OFF state, so that node N8 is brought to the floating state.

Then, driving signal $\phi 4$ attains the high level. This causes the output potential of inverter 15 to attain the low level, so that negative charge is discharged from capacitor 35 to capacitor 25. This causes the potential of node N8 to be a potential in accordance with the ratio of the capacitance of capacitor 25 to the capacitance of capacitor 35, which is expressed by the following expression. In the following expression, $C_{25}$ and $C_{35}$ express the capacitance of capacitors 25 and 35, respectively.

$$-V_{cc} \cdot C_{35}/(C_{25}+C_{35})$$

Then, driving signal $\phi 6$ is made to fall to a potential $(-VA)$ lower than the potential expressed by the above expression. This causes transistor 85 to be brought to ON state, so that the negative charge in node N8 is supplied to N9, and the potential of node N9 becomes the potential expressed by the above expression. That is, $-V_{cc} \cdot C_{35}/(C_{25}+C_{35})$ is provided as a substrate bias voltage $V_{BB}$ from substrate bias circuit 6500.

Then, driving signal $\phi 6$ returns to the high level. This causes transistor 85 to be brought to OFF state, so that node N8 is brought to the floating state.

Then, driving signal $\phi 4$ returns to the low level. This causes the output potential of inverter 15 to attain the high level, so that capacitors 25 and 35 are charged, and the potential of node N8 rises.

Then, driving signal $\phi 5$ returns to the low level. This causes transistor 65 to be brought to ON state, so that positive charge is pulled out of node N8. As a result, the same state as the state in the standby period, i.e. the state in which the potential of node N8 is the ground potential, and only capacitor 35 is charged is brought about.

Thereafter, in the operating period, driving signals $\phi 4$-$\phi 6$ repeats a series of changes in the potentials as described above in a constant cycle. As a result, negative charge of an amount corresponding to $-V_{cc} \cdot C_{35}/(C_{25}+C_{35})$ is supplied from node N8 through transistor 85 to the semiconductor substrate in a constant cycle.

As described above, in the substrate bias circuit according to this embodiment, charging of one 35 of capacitors 25, 35 connected in series with each other, discharging of one capacitor 35 in the state wherein the connection point N8 between capacitors 25, 35 is in the floating state, and supplying of negative charge from connection point N8 to the semiconductor substrate are performed repeatedly, so that the potential expressed by the above expression ($-V_{cc} \cdot C_{35}/(C_{25}+C_{35})$) is always applied to the semiconductor substrate.

The length of the period $\tau$ between the time when o driving signal $\phi 6$ is made to fall and the time when it is made to rise again, i.e. the length of the time between the start of supplying of negative charge from node N8 through transistor 85 to the semiconductor substrate and the start of initialization of capacitors 25, 35 and node N8 for accumulating negative charge of an amount corresponding to a desired substrate bias voltage in node N8 is set according to an expected amount of positive charge generated in the semiconductor substrate.

Cancellations between the negative charge supplied from node N8 to the semiconductor substrate and the positive charge in the semiconductor substrate causes the potential of node N9 to be lowered gradually from the potential ($-V_{cc} \cdot C_{35}/(C_{25}+C_{35})$) which is originally to be taken. Therefore, driving signal $\phi 6$ is made to rise so as to accumulate negative charge in node N8 again before the potential of node N9 rises significantly from the potential to be originally taken due to the application of the negative charge from node N8 to node N9.

As described above, according to the substrate bias circuit of this embodiment, the semiconductor substrate can be always biased to an arbitrary negative potential of $-V_{cc}$ or more in accordance with the ratio of the capacitance $C_{25}$ of capacitor 25 to the capacitance $C_{35}$ of capacitor 35.

Specifically, if the desired substrate bias voltage is $-k \cdot V_{cc}$, such a desired voltage can be applied as the substrate bias voltage to the semiconductor substrate by designing capacitors 25 and 35 so that the ratio ($C_{25}/C_{35}$) of the capacitance $C_{25}$ of capacitor 25 to the capacitance $C_{35}$ of capacitor 35 is set to the value of $(1/k-1)$ $(0<k<1)$.

Therefore, according to this embodiment, it is possible to further enhance the operating speed of the DRAM by biasing the semiconductor substrate to a negative potential higher than in the conventional device.

According to the above embodiment, MOS transistors 65, 85 are provided as transfer gates between node N8 in which negative charge is to be accumulated and the semiconductor substrate and between node N8 and the ground GND, respectively. However, any types of switching elements which are capable of controlling ON/OFF so that accumulation of negative charge in node N8 and supply of negative charge from node N8 to the semiconductor substrate are repeated in such timing as described above may be used as the transfer gates even if they are not MOS transistors.

As described above, according to a voltage generating circuit of the present invention, it is possible to constantly generate an arbitrary potential in accordance with the ratio between the capacitances of capacitors connected in series with each other with little through current generated. Therefore, a half Vcc generating circuit with power consumption smaller than that in the conventional device, a substrate bias circuit capable of biasing a semiconductor substrate to an arbitrary potential, and the like are provided.

It is desirable that the output voltage of a voltage generating circuit according to the present invention is used for holding a load in which current is not consumed at high speed to a predetermined potential, for example, for precharging a signal line, for biasing a semiconductor substrate, and the like.

Although the present invention is applied to a semiconductor integrated circuit device in all the above embodiments, a voltage generating circuit according to the present invention is not necessarily formed on a semiconductor substrate, and it may be constituted with a discrete element.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage generating device for generating a constant voltage to be applied to a predetermined load, comprising:

first and second capacitor means coupled between a first potential source for supplying a constant potential and a second potential source for supplying a potential changing from a first level to a second level in a constant cycle, said first and second capacitor means being connected in series with each other;

first connection means for electrically connecting a connection point between said first capacitor means and said second capacitor means to said first potential source;

second connection means for electrically connecting said connection point to said predetermined load;

first connection control means for deactivating said first connection means in timing earlier than switching of the potential of said second potential source from said first level to said second level and activating said first connection means in timing later than switching of the potential of said second potential source from said second level to said first level; and second connection control means for activating said second connection means in timing later than switching of the potential of said second potential source from said first level to said second level and deactivating said second connection means in timing earlier than switching of the potential of said second potential source from said second level to said first level.

2. The voltage generating device according to claim 1, wherein said first and second capacitor means and said first and second connection means are formed on the same semiconductor substrate.

3. The voltage generating device according to claim 1, wherein a polarity of said constant voltage is positive, said first level and said second level are a low level and a high level, respectively, and said constant potential is at said first level.

4. The voltage generating device according to claim 1, wherein a polarity of said constant voltage is negative, said first level and said second level are a high level and a low level, respectively, and said constant potential is at said second level.

5. A semiconductor memory device, comprising:

a plurality of memory cells arranged in a plurality of columns and formed on a substrate;

a plurality of bit lines provided corresponding to said plurality of columns and each connected, in common, to all the memory cells arranged in a corresponding one of the columns;

first and second input/output lines for transmitting data to be written into one of said plurality of memory cells and data read from one of said plurality of memory cells from outside the substrate and to outside the substrate, respectively;

circuit means for writing data on said first and second input/output lines into one of said plurality of memory cells and reading data from one of said plurality of memory cells onto said first and second input/output lines;

control means for controlling said circuit means; and voltage generating means for generating a constant voltage of a positive polarity to be applied to a predetermined load;

wherein said voltage generating means including:

first and second capacitor means coupled between a first potential source for supplying a constant potential and a second potential source for supplying a potential changing from a first level to a second level in a constant cycle, said first and second capacitor means being connected in series with each other; and first connection means for electrically connecting a connection point between said first capacitor means and said second capacitor means to said first potential source, second connection means for electrically connecting said connection point to said predetermined load, first connection control means for deactivating said first connection means in timing earlier than switching of the potential of said second potential source from said first level to said second level and activating said first connection means in timing later than switching of the potential of said second potential source from said second level to said first level, and second connection control means for activating said second connection means in timing later than switching of the potential of said second potential source from said first level to said second level and deactivating said second connection means in timing earlier than switching of the potential of said second potential source from said second level to said first level, wherein the capacitance of said first capacitor means is equal to the capacitance of said second capacitor means, said first and second levels are a low level and a high level, respectively, and said predetermined load includes said substrate, said plurality of bit lines, and said first and second input/output lines.

6. The semiconductor memory device according to claim 5, wherein said semiconductor memory device receives a predetermined control signal, said control means controls said circuit means in response to said predetermined control signal, and said first and second connection control means includes oscillation means having a constant oscillation period, selection means for selecting either an output signal of said oscillation means or said predetermined control signal, and generating means for generating first and second signals for controlling said first and second connection means, respectively, in response to the signal selected by said selection means.

7. The semiconductor memory device according to claim 6, wherein said first connection means includes a first switching element connected between said first potential source and said connection point and having its on/off controlled by said first signal, and said second connection means includes a second switching element connected between said connection point and said predetermined load and having its on/off controlled by said second signal.

8. The semiconductor memory device according to claim 7, wherein said first switching element includes a field effect semiconductor element having a first conduction terminal connected to said first potential source, a second conduction terminal connected to said connection point, and a control terminal receiving said first signal, and said second switching element includes a field effect semiconductor element having a first conduction terminal connected to said predetermined load, a second conduction terminal connected to said connection point, and a control terminal receiving said second signal.

9. The semiconductor memory device according to claim 6, wherein said generating means further generates a third signal changing from said second level to said first level in said constant cycle, and said second potential source includes means for inverting said third signal.

10. A semiconductor integrated circuit device, comprising:

a semiconductor substrate on which function circuit means for realizing a predetermined function is formed; and voltage generating means formed on said semiconductor substrate for generating a constant voltage for biasing said semiconductor substrate to a predetermined potential;

wherein said voltage generating means includes:

first and second capacitor means coupled between a first potential source for supplying a constant potential and a second potential source for supplying a potential changing from a first level to a second level in a constant cycle, said first and second capacitor means being connected in series with each other, and first connection means for electrically connecting a first connection point between said first capacitor means and said second capacitor means to said first potential source, second connection means for electrically connecting said first connection point to said semiconductor substrate, first connection control means for deactivating said first connection means in timing earlier than switching of the potential of said second potential source from said first level to said second level and activating said first connection means in timing later than switching of said potential of said second potential source from said second level to said first level, and second connection control means for activating said second connection means in timing later than switching of the potential of said second potential source from said first level to said second level and deactivating said second connection means in timing earlier than switching of the potential of said second potential source from said second level to said first level.

11. A semiconductor memory device, comprising:

a plurality of memory cells arranged in a plurality of columns;

a plurality of bit lines provided corresponding to said plurality of columns and each connected, in common, to all the memory cells arranged in a corresponding one of the columns;

first and second input/output lines for transmitting data to be written into one of said plurality of memory cells and data read from one of said plurality of memory cells from outside a semiconductor substrate and to outside the semiconductor substrate, respectively;

circuit means for writing data on said first and second input/output lines into one of said plurality of memory cells and reading data from one of said plurality of memory cells onto said first and second input/output lines;

control means for controlling said circuit means, said plurality of memory cells, said plurality of bit lines, said first and second input/output lines, said circuit means, and said control means being formed on said semiconductor substrate;

first voltage generating means formed on said semiconductor substrate for generating a voltage of a positive polarity for precharging said plurality of bit lines and said first and second input/output lines; and second voltage generating means formed on said semiconductor substrate for generating a voltage of a negative polarity for biasing said semiconductor substrate;

wherein said first voltage generating means includes:

first and second capacitor means coupled between a first potential source for supplying a constant potential and a second potential source for supplying a potential changing from a first level to a second level in a constant cycle, said first and second capacitor means being connected in series with each other, and first connection means for electrically connecting a first connection point between said first capacitor means and said second capacitor means to said first potential source, second connection means for electrically connecting said first connection point to said plurality of bit lines and said first and second input/output lines, first connection control means for deactivating said first connection means in timing earlier than switching of the potential of said second potential source from said first level to said second level and activating said first connection means in timing later than switching of the potential of said second potential source from said second level to said first level, and second connection control means for activating said second connection means in timing later than switching of the potential of said second potential source from said first level to said second level and deactivating said second connection means in timing earlier than switching of the potential of said second potential source from said second level to said first level, and wherein said second voltage generating means includes:

third and fourth capacitor means coupled between said first potential source and a third potential source for supplying potential changing from said second level to said first level in a constant cycle, said third and fourth capacitor means being connected in series with each other, and third connection means for electrically connecting a second connection point between said third capacitor means and said fourth capacitor means to said first potential source, fourth connection means for electrically connecting said second connection point to said semiconductor substrate, third connection control means for deactivating said third connection means in timing earlier than switching of the potential of said third potential source from said second level to said first level and activating said third connection means in timing later than switching of the potential of said third potential source from said first level to said second level, and fourth connection control means for activating said fourth connection means in timing later than switching of the potential of said third potential source from said second level to said first level and deactivating said fourth connection means in timing earlier than switching of the potential of said third potential source from said first level to said second level.

12. The semiconductor memory device according to claim 11, wherein said first level and said second level are a low level and a high level, respectively, said constant potential is at said first level, and the capacitance of said first capacitor means is equal to the capacitance of said second capacitor means.

13. The semiconductor memory device according to claim 12, wherein said semiconductor memory device receives a predetermined control signal, said control means controls said circuit means in response to said predetermined control signal, and said first and second connection control means includes:

oscillation means having a constant oscillation period;

selection means for selecting either an output signal of said oscillation means or said predetermined control signal; and generating means responsive to the signal selected by said selection means for generating first to fourth signals for controlling said first to fourth connection means, respectively.

14. The semiconductor memory device according to claim 13, wherein said first connection means includes a first switching element connected between said first potential source and said first connection point and having its on/off controlled by said first signal, said second connection means includes a second switching element connected between said first connection point and said plurality of bit lines and said first and second input/output lines and having its on/off controlled by said second signal, said third connection means includes a third switching element connected between said first potential source and said second connection point and having its on/off controlled by said third signal, and said fourth connection means includes a fourth switching element connected between said second connection point and said semiconductor substrate and having its on/off controlled by said fourth signal.

15. The semiconductor memory device according to claim 14, wherein said first switching element includes a field effect semiconductor element having a first conduction terminal connected to said first potential source, a second conduction terminal connected to said connection point, and a control terminal receiving said first signal, said second switching element includes a field effect semiconductor element having a first conduction terminal connected to said plurality of bit lines and said first and second input/output lines, a second conduction terminal connected to said connection point, and a control terminal receiving said second signal, said third switching element includes a field effect semiconductor element having a first conduction terminal connected to said first potential source, a second conduction terminal connected to said connection point, and a control terminal receiving said third signal, and said fourth switching element includes a field effect semiconductor element having a first conduction terminal connected to said semiconductor substrate, a second conduction terminal connected to said connection point, and a control terminal receiving said fourth signal.

16. The semiconductor memory device according to claim 13, wherein said generating means further generates a fifth signal changing from said second level to said first level in a constant cycle and a sixth signal changing from said second level to said first level in a constant cycle, said second potential source includes means for inverting said fifth signal, and said second potential source includes means for inverting said sixth signal.

17. The voltage generating device according to claim 1, wherein said predetermined load is a load to be held at said constant voltage, and in a period in which said second connection means is activated, said predetermined load is supplied with charge from said connection point and consumes said supplied charge.

18. The voltage generating device according to claim 17, wherein said second connection means is deactivated in timing earlier than the time when said predetermined load has consumed said charge completely.

19. An operating method of a voltage generating device for generating a constant voltage to be applied to a predetermined load, wherein said voltage generating device comprises first and second capacitor means connected in series to each other and coupled between a first potential source for supplying a constant potential and a second potential source for supplying potential changing from a first level to a second level in a constant cycle, said method comprising the steps of:

electrically separating a connection point between said first capacitor means and said second capacitor means from said first potential source in timing earlier than switching of the potential of said second potential source from said first level to said second level;

electrically connecting said connection point with said first potential source in timing later than switching of the potential of said second potential source from said second level to said first level;

electrically connecting said connection point with said predetermined load in timing later than switching of the potential of said second potential source from said first level to said second level; and electrically separating said connection point from said predetermined load in timing earlier than switching of the potential of said second potential source from said second level to said first level.

* * * * *